United States Patent
Sumiya et al.

(10) Patent No.: US 6,777,037 B2
(45) Date of Patent: Aug. 17, 2004

(54) PLASMA PROCESSING METHOD AND APPARATUS

(75) Inventors: Masahiro Sumiya, Kudamatsu (JP); Hitoshi Tamura, Hikari (JP); Seiichi Watanabe, Tokuyama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/946,626

(22) Filed: Sep. 6, 2001

(65) Prior Publication Data

US 2002/0114897 A1 Aug. 22, 2002

(30) Foreign Application Priority Data

Feb. 21, 2001 (JP) .................................... 2001-045365

(51) Int. Cl.⁷ ............................. H05H 1/02; H05H 1/46
(52) U.S. Cl. ..................... 427/569; 427/570; 216/67; 216/71
(58) Field of Search ................. 427/488, 535, 427/562, 569, 570; 216/67, 71; 438/788, 792

(56) References Cited

U.S. PATENT DOCUMENTS

| | | | |
|---|---|---|---|
| 4,808,258 A | | 2/1989 | Otsubo et al. |
| 4,891,118 A | | 1/1990 | Ooiwa et al. |
| 5,160,397 A | | 11/1992 | Doki et al. |
| 5,289,010 A | * | 2/1994 | Shohet ................... 250/497.21 |
| 5,779,925 A | * | 7/1998 | Hashimoto et al. ........... 216/67 |
| 5,827,435 A | | 10/1998 | Samukawa |
| 5,928,528 A | * | 7/1999 | Kubota et al. .............. 427/569 |
| 6,054,063 A | * | 4/2000 | Ohtake et al. ................ 216/70 |
| 6,165,376 A | * | 12/2000 | Miyake et al. ................ 216/67 |
| 6,200,651 B1 | * | 3/2001 | Roche et al. ................ 427/571 |
| 6,201,208 B1 | * | 3/2001 | Wendt et al. .......... 219/121.41 |
| 6,358,573 B1 | * | 3/2002 | Raoux et al. ................ 427/578 |
| 6,395,641 B2 | * | 5/2002 | Savas ......................... 216/68 |
| 2002/0069971 A1 | * | 6/2002 | Kaji et al. .................... 216/70 |
| 2002/0160125 A1 | * | 10/2002 | Johnson et al. ............. 427/569 |
| 2004/0026235 A1 | * | 2/2004 | Stowell, Jr. ............. 204/192.12 |
| 2004/0055995 A1 | * | 3/2004 | Westerman et al. ............ 216/2 |

* cited by examiner

Primary Examiner—Marianne Padgett
(74) Attorney, Agent, or Firm—Antonelli, Terry, Stout & Kraus, LLP

(57) ABSTRACT

A plasma processing method and apparatus are provided for processing the surface of a semiconductor device or the like through the effect of plasma. A pulsed plasma discharge is performed by switching on and off the high frequency electric power for generating the plasma with a specified off period of the plasma generation, to control an inflow amount of positive and negative charges to sparse and dense portions of device patterns and suppress an electric potential on a gate oxide film. Thereby, a highly accurate etching process with no charging damage can be carried out.

3 Claims, 5 Drawing Sheets

PLASMA PROCESSING METHOD AND APPARATUS

BACKGROUND OF THE INVENTION

1. Field of the Invention

The present invention relates to a plasma processing method and apparatus, and more particularly to the plasma processing method and apparatus which are suited to treat the surface of an element like a semiconductor element through the effect of the plasma.

2. Description of the Related Art

As a technology of processing the surface of a substrate of a semiconductor element of the line through the effect of the plasma, as disclosed in Samakawa U.S. Pat. No. 5,827,435, there has been known a plasma processing method which is arranged to take the steps of generating positive ions in sufficient density by discharging the ECR plasma for about 10 $\mu$sec, stopping the discharge for 100 $\mu$sec for generating a massive number of positive and negative ions, at the same time, applying a RF electric field of 600 kHz into the ions only when the discharge is turned off, and charging only the positive and negative ions having the same mobility onto the substrate for suppressing charging caused by the difference of the mobility among the electrons and ions.

Further, Otsubo et al U.S. Pat. No. 4,808,258 discloses the plasma processing apparatus which is arranged to control distribution of the electron temperature of the plasma and an occurrence ratio of reactive materials such as ions and radicals generated in the plasma according to the reactive conditions by periodically modulating a microwave power and at once controlling the energy distribution of ions charged into a material to be processed from the plasma according to the reaction by periodically changing the voltage to be applied for accelerating the ions to be charged into the material to be processed from the plasma.

Moreover, Ooiwa et al U.S. Pat. No. 4,891,118 and the Doki et al U.S. Pat. No. 5,160,397 disclose the plasma processing apparatus which is arranged to synchronize the occurrence time of a pulse-wise microwave with that of a RF bias voltage.

SUMMARY OF THE INVENTION

With recent enhancement of integrity of a semiconductor integrated circuit, for example, it is likelihood that the gate oxide file of a MOS (Metal Oxide Semiconductor) transistor that is one representative semiconductor is made thinner and the working aspect ratio of the device structure is made larger by making the minimal working dimensions minute. In this kind of microstructure element, the electrons having large random kinetic components caused by the mass difference among the electrons and the ions are captured by the pattern and thereby cannot reach the groove bottom. It means that the groove bottom is shorter of electrons rather than the ions reached on the groove bottom and is thereby charged positively. This phenomenon is called electron shading. This phenomenon brings about a shortcoming that a potential difference is caused between an open area and a line and space area and thereby the gate oxide file is charging-damaged.

The technology disclosed in the foregoing U.S. Pat. No. 5,827,435 is arranged to apply a RF electric field of 600 kHz when the discharge is turned off, charge only the positive and negative ions having the same mobility onto the substrate, and thereby suppress the charging. However, the experiment performed by the inventors of the present application indicated that the charging damage may have an adverse effect on the amounts of electrons and ions flown into the sparse portion with no pattern. The present prior art does not mention the method of suppressing the charging damage, which method is mentioned by the present invention.

Moreover, U.S. Pat. Nos. 4,808,258, 4,891,118, and 5,160,397 do not mention the method of suppressing the charging damage, which method is mentioned by the present invention.

It is an object of the present invention to provide a plasma processing method and apparatus which are configured to suppress the charging damage due to a device structure, thereby making it possible to process the surface with high precision.

In carrying out the object, according to an aspect of the invention, a plasma processing method for processing an object to be processed such as a substrate using a plasma comprises controlling generation of the plasma and incident energy of ions in the plasma to the object independently of each other, wherein, the plasma is intermittently generated and as short as 10 $\mu$sec are secured as an off time of the plasma generation after the plasma discharge is turned off.

According to another aspect of the invention, a plasma processing method for processing a substrate using a plasma comprises controlling generation of the plasma and incident energy of ions in the plasma to the substrate independently of each other wherein, the plasma is intermittently generated and an off time of the plasma generation after the plasma discharge is turned off is secured such that the ratio of negative current to positive current flowing into the substrate is made 10 or less.

According to another aspect of the invention, a plasma processing method for processing a substrate using a plasma comprises controlling generation of the plasma and incident energy of ions in the plasma to the substrate independently of each other wherein, the plasma is intermittently generated at a period of 1 kHz to 90 kHz, the duty ratio is adjusted as 10% or more, and the off time of the plasma generation after the plasma discharge is turned off is secured to have 10 $\mu$sec.

According to another aspect of the invention, in a plasma processing method performed by a plasma processing apparatus including a decompression processing chamber connected to a vacuum exhaust device, a gas supply device for supplying gas to the processing chamber, a plasma generating source having a high frequency power supply for generating time-modulated plasma in the processing chamber, a substrate electrode on which a material to be processed is to be placed, and a bias power supply for supplying a high frequency bias power to the substrate electrode, the high frequency power provided by the plasma generating source is time-modulated such that the occupation ratio of the period of modulating the time of the plasma to the time when the ratio of the negative current to positive current flowing into the substrate is 10 or less to is 40% or more.

In carrying out the object, in a plasma processing apparatus having a decompression processing chamber connected to a vacuum exhaust device, a gas supply device for supplying gas to the processing chamber, a plasma generating source having a high frequency power supply for generating the time-modulated plasma in the processing chamber, a substrate electrode on which a material to be processed may be placed, and a bias power supply for supplying a high frequency bias electric power to the substrate electrode, the high frequency electric power for generating the plasma provided in the plasma generating source is time-modulated so that 40% or more is an occupation ratio of the period of time-modulating the plasma to the time when the ratio of the negative current to positive current flowing into the substrate is 10 or less.

Further, the repetitive frequency of the high frequency power supply for generating the plasma ranges from 1 kHz to 90 kHz and the pulse duty ratio thereof is 60% or less.

Moreover, the high frequency bias electric power to be supplied onto the substrate is time-modulated at a repetitive frequency of 1 kHz or more and a duty ratio of 60% or less.

According to another aspect of the invention, in a plasma processing apparatus having a decompression processing chamber connected to a vacuum exhaust device, a gas supply device for supplying gas to the processing chamber, a plasma generating source having a high frequency power supply for generating the time-modulated plasma in the processing chamber, a substrate electrode on which a material to be processed may be placed, and a bias power supply for supplying a high frequency bias electric power to the substrate electrode, the high frequency electric power for generating the plasma is time-modulated such that 20% or less is an occupation ratio of the period of time-modulating the plasma to a time when negative and positive currents flowing into the substrate are equal to each other.

Further, the repetitive frequency of the high frequency power supply for generating the plasma ranges from 1 kHz to 90 kHz and the pulse duty ratio thereof is 60% or less.

Moreover, the high frequency bias electric power is time-modulated at a repetitive frequency of 1 kHz or more and a duty ratio of 60% or less.

According to another aspect of the invention, in a plasma processing method for processing the substrate as controlling generation of the plasma and incident energy of ions in the plasma to the substrate independently, the plasma is intermittently generated at a period of 1 kHz to 90 kHz, the duty ratio is 10% or more, and the time after the plasma discharge is turned off is secured to have 10 $\mu$sec, and the bias voltage for controlling the incident energy of ions is time-modulated.

Further, the time modulation of the bias voltage is synchronized with the period of generating the plasma.

According to an aspect of the invention, the method comprises the steps of carrying out the pulsed discharge by switching on and off the high frequency electric power for generating the plasma, controlling the off time of the pulsed discharge when the ratio of electron saturated current to ion saturated current (often referred to as the electron/ion saturated current ratio) is less than the predetermined value, controlling an inflow quantity of positive and negative charges to the sparse portion and the dense portion of the device patterns, and thereby suppressing the charging damage.

According to another aspect of the invention, the plasma processing apparatus is arranged to control an off time by switching on and off the high frequency electric power for generating the plasma to be charged, controlling the ratio of positive charges to negative charges to be flown into the sparse portion and the dense portion of the device patterns, and suppressing the voltage generated on a gate oxide film, thereby suppressing occurrence of the charging damage. This makes it possible to perform the highly accurate etching treatment.

DETAILED DESCRIPTION OF THE EMBODIMENTS

Figure 1:
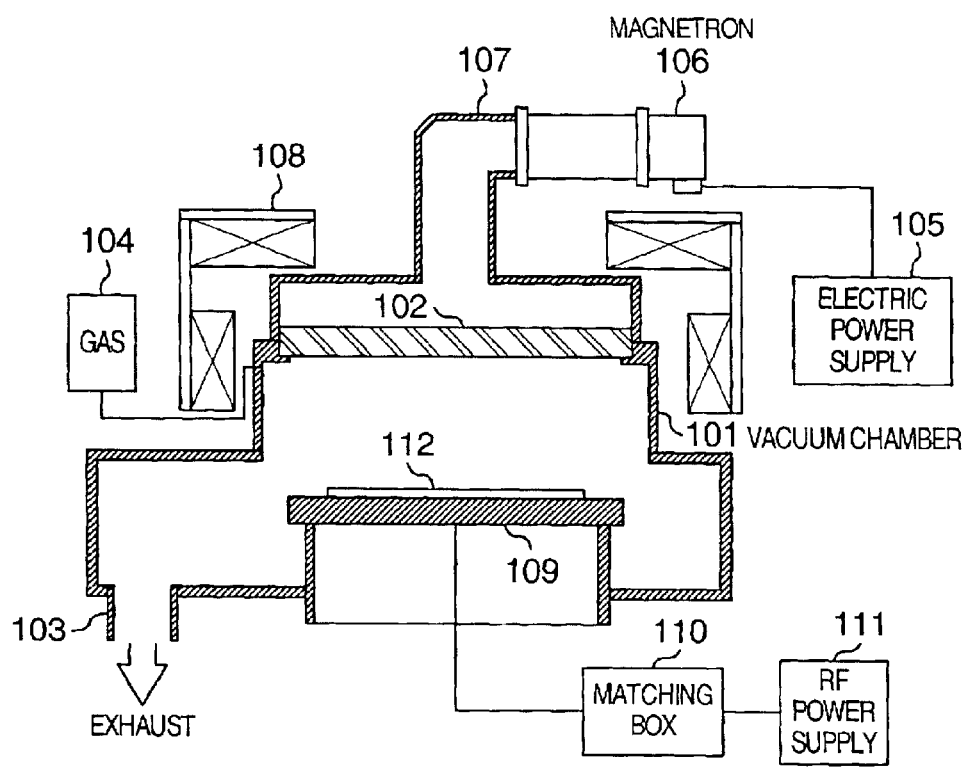
FIG. 1 is a longitudinal section showing an etching apparatus according to a first embodiment of the present invention.

Hereafter, the first embodiment of the present invention will be described with reference to FIGS. 1 to 7. FIG. 1 shows a microwave plasma etching apparatus that is an embodiment of the present invention. A numeral 101 denotes a vacuum chamber the top of which is opened. On the top of the vacuum chamber 101 is placed a dielectric window 102 (such as a quartz window) and then the chamber is sealed. The bottom of the vacuum chamber 101 is connected to a vacuum exhaust device (not shown) through a vacuum exhaust port 103. The upper portion of the vacuum chamber 101 is connected to a gas supply 104. The upper portion of the vacuum chamber 101 is connected to a waveguide 107 and a magnetron 106 through the dielectric window 102. The magnetron 106 is connected to an electric power supply 105 composing a high frequency power supply for generating a plasma together with the magnetron. The electric power supply 105 operates to switch on and off a microwave output at any frequency and any duty ratio. The upper peripheral portion of the vacuum chamber 101 and the partial peripheral portion of the waveguide 107 include a coil 108 wound therearound, the coil being served to generate a magnetic field in the vacuum chamber 101.

On the other hand, a substrate electrode 109 on which a material 112 to be processed may be placed is installed in the lower portion of the vacuum chamber 101. The substrate electrode 109 is connected to a high frequency power supply 111 served as a bias power supply through a matching box 110. The high frequency power supply 111 operates to apply a high frequency electric power (of a frequency 400 kHz, 800 kHz, 2 MHz or the like) to the substrate electrode 109. The power supply 111 also operates to time-modulate the high frequency electric power so that the high frequency power may be oscillated.

In the apparatus constructed as above, for performing the plasma etching process, the inside of the vacuum chamber 101 is decompressed by the vacuum exhaust device (not shown). Then, the gas supply 104 is served to introduce etching gas to the vacuum chamber 101 and the inside pressure of the vacuum chamber 101 is adjusted to a proper value. Next, the microwave of 2.45 GHz, for example, oscillated by the electric power supply 105 and the magnetron 106 is propagated into the waveguide 107 and then is introduced into the vacuum chamber 101 through a dielectric window 102. This microwave electric power is reacted with the magnetic field of 875 G, for example, generated by the coil 108 for generating the magnetic field so that the gas is efficiently ionized inside of the vacuum chamber 101 for generating the plasma.

The unevenness of positive and negative charges to be flown into the dense portion and the sparse portion of the device patterns brings about the charging damage resulting from the electronic shading. In this embodiment, the microwave pulse to be charged by the high frequency power supply for generating the plasma is controlled on and off for carrying out the pulsed discharge. This makes it possible to reduce the charging damage.

Figure 2:
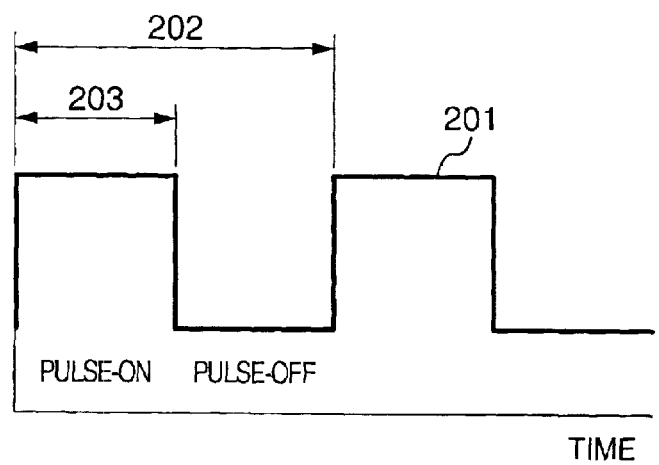
FIG. 2 is a graph showing an On/Off waveform of a pulsed discharge carried out in the embodiment shown in FIG. 1.

FIG. 2 shows an on-off waveform of the pulsed discharge executed by the high frequency power supply for generating the plasma. The pulse on-off waveform 201 is a repetitive waveform of a period 202. A pulse-on time 203/pulse period 202×100 is called a duty ratio. An inverse of the period is called a repetitive frequency. In this case, the repetitive frequency ranges from 1 kHz to 100 kHz.

Figure 3:
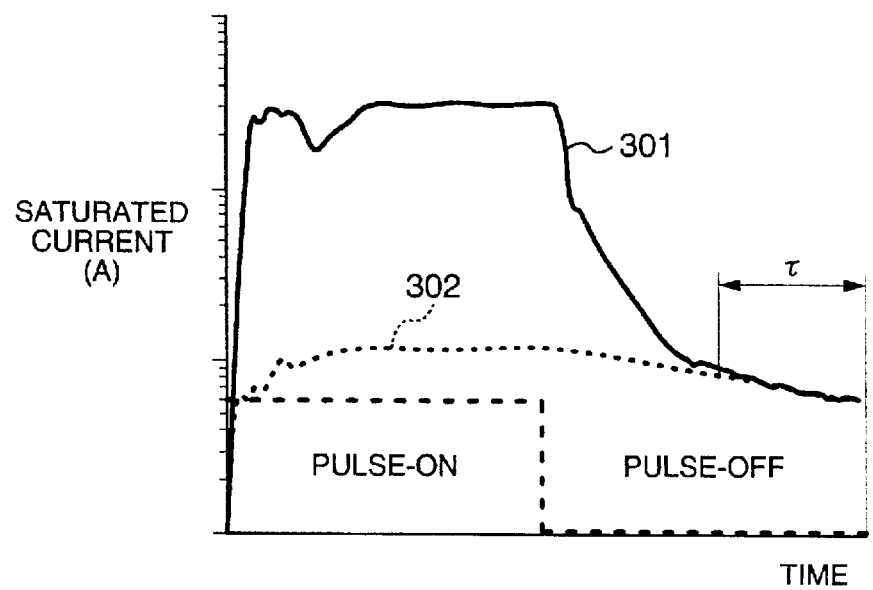
FIG. 3 is a graph showing a change on time of ion and electron saturated current to be charged to the pattern in the pulsed discharge carried out in the embodiment shown in FIG. 1.
Figure 4:
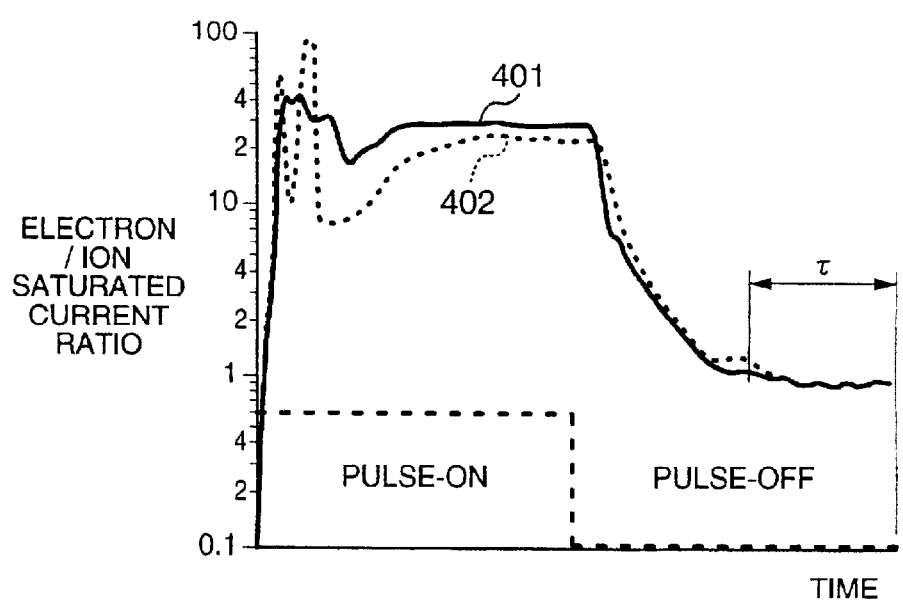
FIG. 4 is a graph showing a change on time of a ratio of ion saturated current to electron saturated current to be charged to the pattern in the pulsed discharge carried out in the embodiment shown in FIG. 1.

In turn, the description will be oriented to the effect of the pulsed discharge executed by the high frequency power supply for generating the plasma with reference to FIGS. 3 and 4. FIG. 3 shows time versus ion and electron saturated currents charged into the device pattern in the pulsed discharge, in which figure the axis of ordinate denotes a saturated current by logarithmic scale and an axis of abscissa denotes a time. In this case, the period of the pulsed discharge is 10 kHz. In FIG. 3 the ratio of the pulse-on to the pulse-off is indicated as 50%. During the pulse-on period the great difference takes place between the electron saturated current 301 and the ion saturated current 302, while at a time when the pulse-off period is started, the electron saturated current 301 is abruptly decreased. Then, during the time τ, the electron saturated current 301 is made equal to the ion saturated current 302. In this case, the ratio of the time τ at one period was substantially 20%.

Then, FIG. 4 shows the change on time of a ratio of an electron saturated current to an ion saturated current (ratio of negative current to positive current) to be charged to the dense portion and the sparse portion of the device patterns when the pulsed discharge is carried out. In FIG. 4, an axis of ordinate denotes an electron/ion saturated current ratio by logarithmic scale and an axis of abscissa denotes a time. In this case, the period of the pulsed discharge is 10 kHz. In FIG. 4, a ratio of a pulse-on to a pulse-off is indicated as 50%. During the pulse-on period, the ratio 401 of electron and ion saturated currents to be charged to the sparse portion is greater than the ratio 402 of electron to ion saturated currents to be charged to the dense portion. As soon as the pulse-off period is started, the difference is abruptly made smaller. In the sparse portion and the dense portion, during the time τ, the electron/ion saturated current ratio comes closer to 1 (one). In this case, the ratio of the time τ in one period was substantially 20%. Further, when the pulsed discharge is turned off, after the time when the electron/ion saturated current ratio is made 10 or less, that is, later than about 1/10 time of one period time after the pulsed discharge is turned off, the electron/ion saturated current ratios for the sparse portion and the dense portion are made substantially equal to each other. That is, in the pulsed discharge, later than the time when the electron/ion saturated current ratio after the pulse-off period is made 10 or less, the difference of the electron/ion saturated current ratio between the sparse potion and the dense portion of the device patterns is small during the pulse-off period. This thus makes it possible to suppress the occurrence of the voltage on the gate oxide film composing the MOS device, thereby reducing the charging damage.

Figure 5:
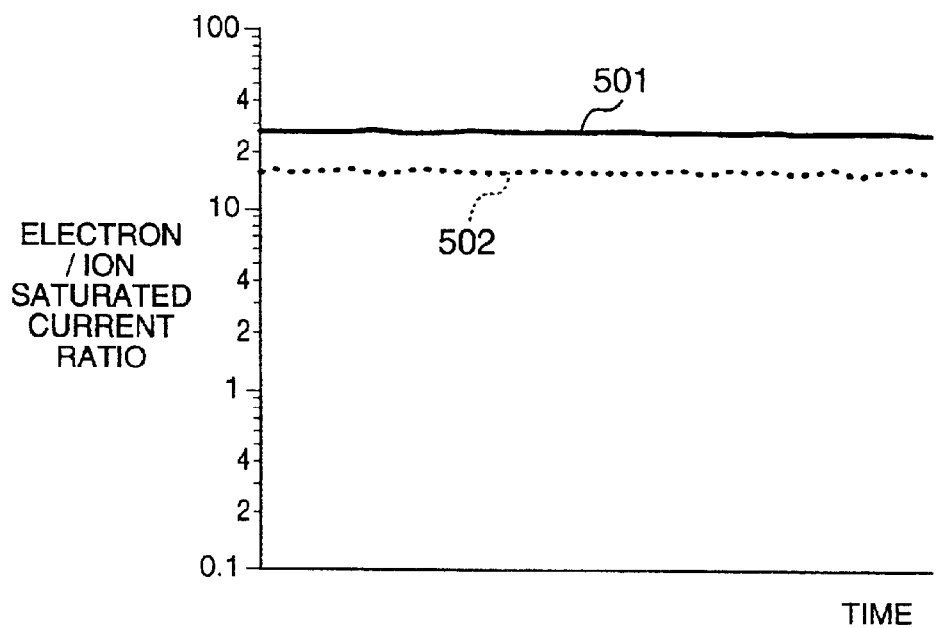
FIG. 5 is a graph showing a change on time of a ratio of ion saturated current to electron saturated current to be discharged to the pattern in the continuous discharge carried out by the conventional apparatus for the reference.

For comparison, FIG. 5 shows the change on time of the ratio of electron to ion saturated currents to be charged into the sparse portion and the dense potion of the pattern devices in the continuous discharging time according to the prior art, in which figure the axis of ordinate denotes an electron/ion saturated current ratio by logarithmic scale and the axis of abscissa denotes a time. The ratio 501 of electron to ion saturated currents to be charged into the sparse portion is larger than the electron/ion saturated current ratio 502 to be charged into the dense portion. This is because the electrons to be charged to the dense portion are reduced by the electron shading. The difference of the amount of charges to be charged into the sparse portion and the dense portion of the device patterns as shown in FIG. 5 is the cause of the charging damage. On the other hand, the pulsed discharge according to this embodiment enables to reduce the charging damage because the difference of the charges to be charged into the sparse portion and the dense portion during the pulse-off period is small.

Figure 6:
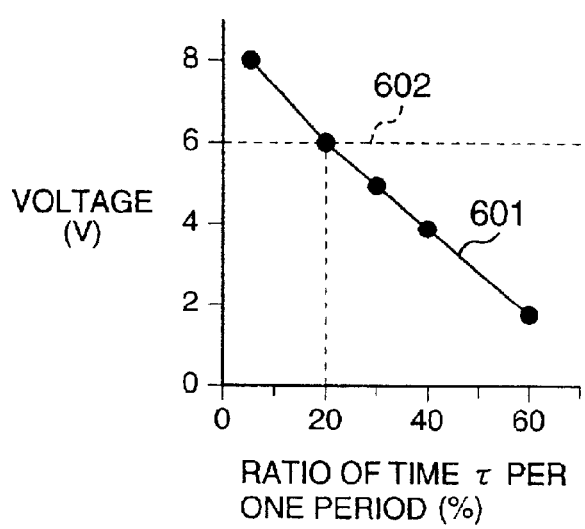
FIG. 6 is a graph showing $\tau$ dependency of a gate oxide film voltage on time in the embodiment shown in FIG. 1.

FIG. 6 shows the relation between the ratio of the time τ per one plus period, the time τ when the electron/ion saturated current ratio becomes 1 during the pulse-off period, and the voltage generated on the gate oxide film. Herein, the pulse period is 10 kHz. In FIG. 6, an axis of ordinate denotes a voltage and an axis of abscissa denotes a ratio of the time τ per one period. Both of the axes are denoted by linear scale. The voltage 601 on the gate oxide film is progressively reduced with increase of the ratio of the time τ per one period. For example, when the ratio of the time τ per one period is 20% or less, the voltage that is more than the breakdown voltage 602 (6 V in this case) of the gate oxide film is applied onto the gate oxide film. When the time τ is 20 μsec or longer, the gate oxide film voltage can be suppressed to be the gate break-down voltage 602 or lower. This makes it possible to suppress the charging damage.

It will be understood from FIG. 4 that the foregoing condition holds true to the fact that the ratio of the time when the electron/ion saturated current ratio is 10 or less per one pulse period is 40% or more. Hence, by adjusting the pulse repetitive frequency and the duty ratio of the high frequency power supply for generating the plasma and increasing the ratio of the time τ per one pulse period or the ratio of the time when the electron/ion saturated current ratio is 10 or less per one pulse period, it is possible to reduce the charging damage, thereby making it possible to perform the etching process with high precision.

Further, the foregoing condition is effective in the range where the pulse repetitive frequency is 1 kHz to 90 kHz and the duty ratio is 60% or less. For example, if the pulse frequency is as low as 1 kHz, the time of one period is made longer, so that if the duty ratio is 50% or more, the pulse-off time can be secured. Concretely, as to the frequency of 1 kHz, when the duty ratio is 60%, the pulse-off time is 600 μsec. Hence, as to the time after the pulse-off period, though the duty ratio may be made 60% or more, if the pulse-on period extends for a longer time, the charging time is made longer accordingly. As a result, the voltage of the gate oxide film reaches the breakdown voltage (for example, 6 V), so that as to the frequency of 1 kHz, it is preferable to lower the duty ratio to 60% or less.

Conversely, if the pulse frequency is as high as 50 kHz, the time of one period is made shorter, so that by lowering the duty ratio to 50% or less, the pulse-off time can be secured. Concretely, for generating the plasma, it is necessary to keep the duty ratio 10% and to secure a time of 10 µsec at minimum for lowering the difference of the electron/ion saturated current ratio after the plasma-off period. Hence, the pulse discharging period is about 90 kHz. In this embodiment, the condition is effective in the range where the pulse repetitive frequency is 1 kHz to 90 kHz and the duty ratio is 60% or less.

Figure 7:
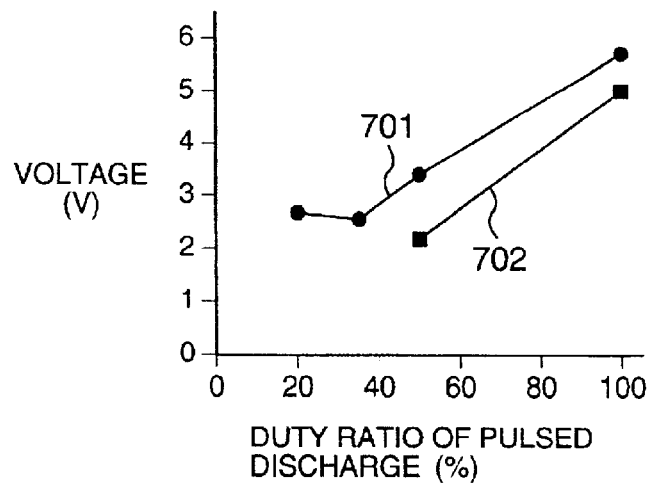
FIG. 7 is a graph showing dependency of a pulse duty ratio on a gate oxide film voltage when a bias voltage is applied in the embodiment shown in FIG. 1.

The foregoing effect of reducing the charging damage is more improved by supplying to the substrate the high frequency bias electric power modulated on time. FIG. 7 shows the dependency of the pulse duty ratio in the case 701 of continuously applying the bias power to the substrate and in the case 702 of applying the bias electric power modulated on time (in which the power frequency is 400 kHz, the repetitive frequency is 2 kHz, and the duty ratio is 40%). In FIG. 7, an axis of ordinate denotes a voltage to be applied onto the gate oxide film and an axis of abscissa denotes a duty ratio of the pulsed discharge. Both of the axes are denoted by linear scale. In this case, the pulse discharging period is 10 kHz.

It is understood from FIG. 7 that as to the continuous bias and the time-modulated (TM) bias, as the pulse duty ratio is reduced so that the time τ is made longer, the voltage occurring on the gate oxide film is reduced accordingly. Further, the voltage of the gate oxide film is suppressed in the case 702 of applying the time-modulated bias power more than the case 701 of applying the continuous bias power. This reason is as follows: as to the continuous bias power, the electron/ion saturated current ratio is made larger because the ions in the plasma are continuously pulled into the substrate, while since the off time is secured in the application of the time-modulated bias power, the ions charged to the substrate are decreased so that the electron/ions saturated current ratio may be increased.

Further, as to the time-modulated bias power, the pulse discharging period is synchronized with the time-modulated bias power and the on period of the pulsed discharge is also synchronized with the on period of the time-modulated bias power. This makes it possible to lower the voltage appearing on the gate oxide film. In the off time of the pulsed discharge, as to the continuous bias, the ions in the plasma being attenuated are charged onto the substrate after the pulse-off period, while as to the time-modulated bias power, no function is provided of charging the ions in the plasma into the substrate after the pulsed discharge. As shown in FIG. 4, it is considered that the electron/ion saturated current ratio is quickly decreased in the sparse portion on the surface of the substrate.

The repetitive frequency of the time-modulated bias needs a faster period than the charging time or the attenuating time that is about 1 msec. It means that the repetitive frequency is required to have 1 kHz or more. Though the frequency of the bias power supply is not specified, it is necessary to define the upper limit of the repetitive frequency to be a half of the power frequency or lower.

According to the present embodiment, by performing the pulsed discharge by switching on and off the high frequency power for generating the plasma and controlling the off time of the pulsed discharge to be lower than the predetermined electron/ion saturated current ratio, the inflow amount of the positive and the negative charges to the sparse portion and the dense portion of the device patterns is controlled so that the potential of the gate oxide film may be lowered. This thus makes it possible to perform the accurate etching process with no charging damage.

In the case of applying the high frequency bias to the substrate having a portion to be etched of the sparse patterns for performing the plasma process, by adjusting the pulse repetitive frequency and the duty ratio and increasing the ratio of the time τ when the electron/ion saturated current ratio is 1 per one pulse period or the ratio of the time when the electron/ion saturated current ratio is 1/10 or less per one pulse period, at which ratio of 1/10 the difference of the electron/ion saturated current ratio between the spare and the dense portions of the patterns becomes small, it is possible to lower the charging damage. Further, by combining the time-modulated bias with the pulsed discharge and synchronizing both with each other, it is possible to reduce the voltage occurring on the gate oxide film, thereby reducing the charging damage and making it possible to perform the highly accurate etching process.

[Second Embodiment]

Figure 8:
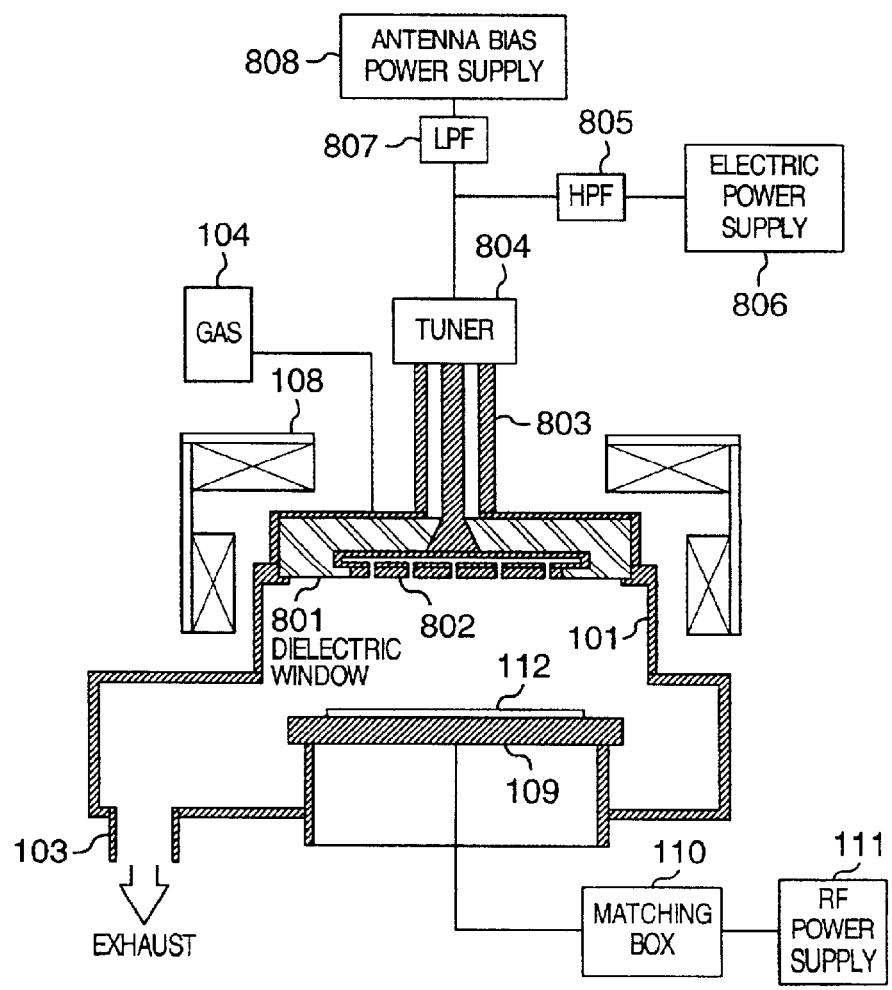
FIG. 8 is a longitudinal section showing an etching apparatus according to a second embodiment of the present invention.

The second embodiment of the present invention will be described with reference to FIG. 8. In this figure, the same numerals as those of FIG. 1 denote the same members about which description will be left out. The different respect of FIG. 8 from that of FIG. 1 will be described below. The upper portion of the vacuum chamber 101 is sealed by a dielectric window 801 (made of quartz, for example) and an upper electrode 802 (made of Si, for example). The upper electrode 802 has a porous structure from which etching gas is flown and is connected to gas supply device 104. The high frequency electric power such as 450 MHz power oscillated by an electric power supply 806 is transmitted to a tuner 804 through a high-pass filter 805. The high frequency electric power such as 13.56 MHz power oscillated by an antenna bias power supply 808 is also transmitted to the tuner 804 through a low-pass filter 807. These high frequency powers are then propagated to the inside of the vacuum chamber 101 through an coaxial path and the dielectric window and the upper electrode 802, in which chamber 803 the plasma is generated. The microwave supply 806 and the antenna bias power supply 808 serve as the high frequency power supply for generating the plasma and to oscillate the modulated pulse. On the other hand, the substrate electrode 109 is connected to a high frequency power supply 111 served as the bias power supply. Like the apparatus of the first embodiment, the apparatus constructed as in this embodiment enables to control the inflow amount of positive and negative charges into the sparse and the dense portions of the patterns so as to suppress the potential on the gate oxide film by performing the pulsed discharge and applying the time-modulated bias, thereby making it possible to perform the highly accurate etching with no charging damage.

[Third Embodiment]

Figure 9:
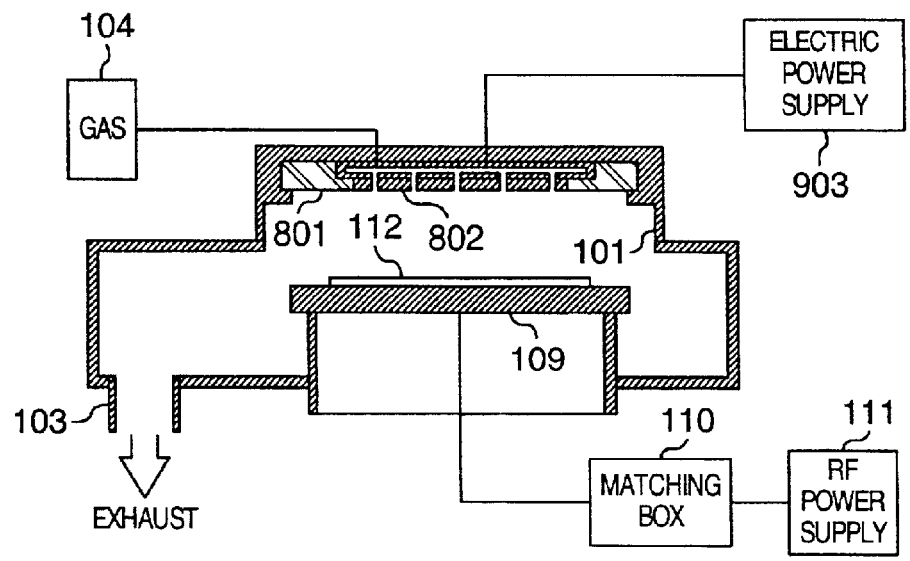
FIG. 9 is a longitudinal section showing an etching apparatus according to a third embodiment of the present invention.

The third embodiment of the present invention will be described with reference to FIG. 9. In FIG. 9, the same numerals as those of FIG. 1 denote the same members. The different respect of FIG. 9 from that of FIG. 1 will be described below. The upper portion of the vacuum chamber 101 is sealed by the dielectric window 801 (made of quartz, for example) and the upper electrode 802 (made of Si, for example). The upper electrode 802 has a porous structure from which the etching gas is to be flown and is connected to the gas supply device 104. A high frequency electric power of, for example, 27 MHz or 60 MHz, oscillated by the electric power supply 903 serving as a high frequency power supply for generating the plasma is propagated to the inside of the vacuum chamber 101 through the upper electrode 802 in which chamber 101 the plasma is generated. The electric power supply 903 may be served to oscillate the modulated pulse. On the other hand, the substrate electrode 109 is connected to a high frequency power supply 111 serving as a bias power supply. Like the construction of the first embodiment, the apparatus constructed as in this embodiment enables to control the inflow amount of positive and negative charges into the sparse and the dense portions of the patterns so as to suppress the potential on the gate oxide film by performing the pulsed discharge and applying the time-modulated bias, thereby making it possible to perform the highly accurate etching with no charging damage.

[Fourth Embodiment]

Figure 10:
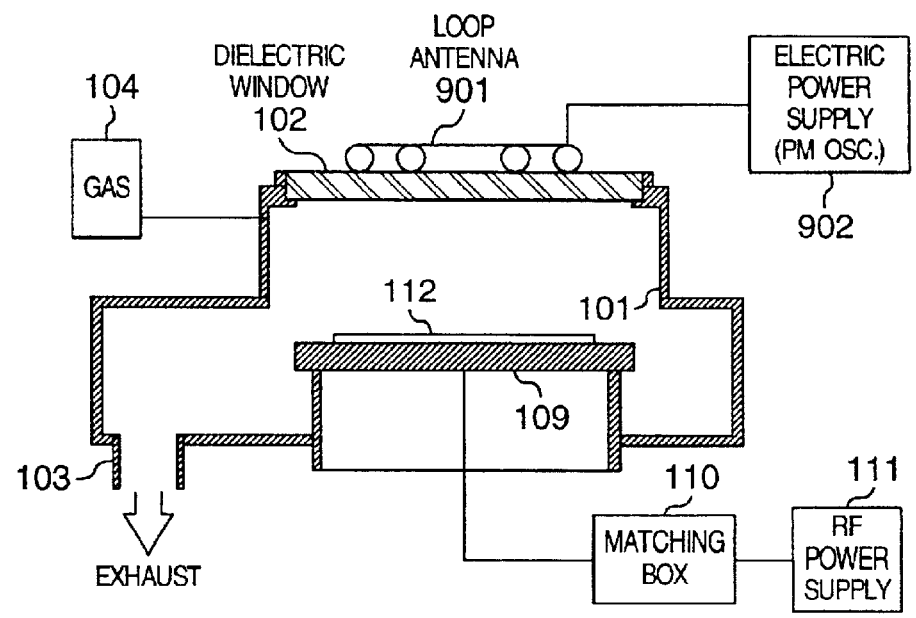
FIG. 10 is a longitudinal section showing an etching apparatus according to a fourth embodiment of the present invention.

The fourth embodiment will be described with reference to FIG. 10. In this figure, the same numerals as those of FIG. 1 denote the same members. The different respect of FIG. 1 from that of FIG. 10 will be described below. The upper portion of the vacuum chamber 101 is sealed by the dielectric window 102. A numeral 901 denotes a loop antenna installed on top of the dielectric window 102, which antenna is connected to an antenna power supply 902 of 13.56 MHz. The high frequency electric power is supplied from the loop antenna 901 to the inside of the vacuum chamber 101 through the dielectric window 102, in which chamber 101 the plasma is generated by the high frequency power. The antenna power supply 902 serving as the high frequency power supply for generating the plasma enables to oscillate the modulated pulse. On the other hand, the substrate electrode 109 is connected to the high frequency power supply 111 serving as the bias power supply. Like the construction of the first embodiment, the apparatus constructed as in this embodiment enables to control the inflow amount of the positive and the negative charges to the sparse and the dense portions of the patterns so as to suppress the potential on the gate oxide film, thereby making it possible to perform the highly accurate etching with no charging damage.

The foregoing embodiments have been described about the etching apparatus. In place, the present invention may be applied to another plasma processing apparatus such as an ashing apparatus and a CVD apparatus.

According to the embodiments of the present invention, as set forth above, these embodiments are constructed to control the pulsed discharge condition so as to enhance a ratio of a time τ when the electron/ion saturated current ratio of the pulse-off period is 1 per one period or a ratio of the time when the electron/ion saturated current ratio is 10 or less per one pulse period, at which ratio of 10 or less the difference of the electron/ion saturated current ratio between the sparse and the dense portions of the patterns becomes small, that is, make the time when the electron/ion saturated current ratio is lower than the predetermined value, thereby making it possible to suppress the charging damage caused by the electronic shading.

What is claimed is:

1. A plasma processing method for processing a substrate by controlling generation of plasma and incident energy of ions in the plasma to the substrate independently of each other, comprising:

supplying a gas to a vacuum processing chamber;

intermittently generating the plasma in the vacuum processing chamber by switching on and off a high frequency electric power;

supplying a high frequency bias electric power to a substrate electrodes on which a substrate to be processed is placed; and securing at least an off time for which a ratio of an electron saturated current to an ion saturated current which is positive current to be charged to the substrate is less than 10 after turn off of the plasma.

2. A plasma processing method executed by a plasma processing apparatus including a vacuum processing chamber connected to a vacuum exhaust device, a gas supply device for supplying gas to the vacuum processing chamber, plasma generating means having a high frequency power supply for generating time-modulated plasma in the vacuum processing chamber, a substrate electrode on which a substrate to be processed is placed and a bias power supply for supplying a high frequency bias electric power to the substrate electrode, comprising:

time-modulating a high frequency electric power for generating the plasma such that an off time of the high frequency electric power for which a ratio of an electron saturated current to an ion is 40% or more per one period of time modulation saturated current which is positive current to be charged to the substrate, is less than 10 is; and generating the plasma with application of the time-modulated high frequency electric power by the plasma generating means.

3. A plasma processing method according to claim 2, wherein a repetitive frequency of the high frequency power supply for generating the plasma ranges from 1 kHz to 90 kHz.

* * * * *